(12) United States Patent
Chua et al.

(10) Patent No.: US 7,776,648 B2
(45) Date of Patent: Aug. 17, 2010

(54) HIGH THERMAL PERFORMANCE PACKAGING FOR CIRCUIT DIES

(75) Inventors: Kok Hua Chua, Singapore (SG); Budi Njoman, Singapore (SG); Zheng Peng Xiong, Singapore (SG)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/160,233

(22) PCT Filed: Dec. 21, 2006

(86) PCT No.: PCT/US2006/049073

§ 371 (c)(1),
(2), (4) Date: Jul. 8, 2008

(87) PCT Pub. No.: WO2008/076126

PCT Pub. Date: Jun. 26, 2008

(65) Prior Publication Data

US 2009/0001561 A1    Jan. 1, 2009

(51) Int. Cl.
*H01L 21/00* (2006.01)

(52) U.S. Cl. .................. 438/106; 438/122; 438/126; 438/127; 257/787; 257/738; 257/706

(58) Field of Classification Search .................. 438/106, 438/113, 114, 122, 124, 126, 127; 257/787, 257/738, 706
See application file for complete search history.

(56) References Cited

U.S. PATENT DOCUMENTS

| 6,238,954 B1 * | 5/2001 | Ma et al. ..................... 438/122 |
| 6,486,562 B1 * | 11/2002 | Kato .......................... 257/778 |
| 6,611,047 B2 * | 8/2003 | Hu et al. ..................... 257/666 |
| 2002/0180040 A1 | 12/2002 | Camenforte et al. |
| 2003/0164543 A1 * | 9/2003 | Kheng Lee ................. 257/706 |
| 2004/0033283 A1 * | 2/2004 | Thummel .................... 425/116 |
| 2004/0217389 A1 | 11/2004 | Hall et al. |

* cited by examiner

*Primary Examiner*—Matthew Smith
*Assistant Examiner*—Wilner Jean Baptiste
(74) *Attorney, Agent, or Firm*—Ryan, Mason & Lewis, LLP

(57) ABSTRACT

A circuit die is disposed into a region defined by a mold. A molding material is then introduced into the region to encapsulate the circuit die. Prior to substantial curing of the molding material, at least a portion of the molding material is removed from over a surface of the circuit die, creating a recessed region in the encapsulating material. A heat spreader may then be disposed within the recessed region, as well as over the top surface of the encapsulating material. The heat spreader may have a downset that substantially aligns with the recessed region and reduces the distance between the heat spreader and the spacer for better heat dissipation.

14 Claims, 19 Drawing Sheets

HIGH THERMAL PERFORMANCE PACKAGING FOR CIRCUIT DIES

FIELD OF THE INVENTION

The present invention relates generally to the packaging of a circuit die. More particularly, the present invention discloses a method, and related circuit package, that provides a heat spreader disposed over a circuit die with substantially no intervening molding material.

BACKGROUND OF THE INVENTION

As circuit dimensions continue to decrease, it has become increasingly important to provide ways to remove heat from the circuit die. Indeed, a significant limiting factor in the speed and density of electronic devices is the ability to satisfactorily remove the heat that such devices develop while operating. To this end, heat spreaders are now commonly employed in many circuit packages.

FIG. 1 illustrates an encapsulation step in the prior art for a Fully Molded and Separated Ball Grid Array (FSBGA). A partially formed FSBGA device 10 includes a circuit die 20, a spacer 30 and a substrate 40 adhered to each other. The circuit die 20 may be any die known in the art, such as a silicon substrate, a GaAs substrate, a silicon-on-glass substrate, etc. The spacer 30 may also be made of any of these substrate materials, which may be chosen for high thermal conductivity characteristics, and which is typically made of silicon. A first adhesive layer 12 adheres the backside of the spacer 30 to an active surface 22 of the circuit die 20. The spacer 30 is basically a non-active die, and primarily serves to transfer heat away from the surface of the circuit die 20. The spacer 30 thus typically has no electrical connection to any external circuitry. A second adhesive layer 14 adheres a backside 25 of the circuit die 20 to the substrate 40. The second adhesive layer 14 may be either electrically conductive or non-conductive, but is usually conductive to provide greater thermal dissipation properties. The substrate 40 is typically a laminate, and includes non-conductive regions 42 and conductive regions 44. The non-conductive regions 42 may be made from, for example, an organic material, such as Bismaleimide Triazine (BT), and the conductive regions 44 may be made from copper, aluminum or the like. Vias 46, filled with a conductive material, provide a conductive pathway that electrically connects conductive regions 44 on the top surface 41 with their respective counterpart regions on the bottom surface 49 of the substrate 40. Bond wires 50 electrically connect pads 24 on the active surface 22 of the circuit die 20 with corresponding wedges 48 on the top surface 41 of the substrate 40. The wedges 48 electrically connect with the vias 46, and hence with the bottom surface 49 of the substrate 40, by way of the conductive regions 44.

The partially formed FSBGA device 10 is disposed within a mold 60 to undergo an encapsulation process. Although only a single device 10 is shown in FIG. 1, it will be appreciated that typically multiple devices 10 are encapsulated at once within the mold 60. The mold 60 includes a top plate 62 and a bottom plate 64; a cavity 66 between the top plate 62 and bottom plate 64 is filled with a molding material 70, indicated in FIG. 2. However, to insure that a maximum amount of heat can escape from the circuit die 20, it is highly desirable that the top surface 32 of the spacer 30 remain exposed. That is, it is desired that no molding material 70 cover the top surface 32 during the encapsulation process.

The encapsulation process is analogous to injection molding procedures used to make, for example, plastic goods. A considerable amount of pressure may be exerted upon the molding material 70 within the cavity 66, and as a result, even small gaps between the top surface 32 of the spacer 30 and the top mold plate 62 can lead to mold flash over the top surface 32. Hence, it is essential that the top surface 32 be flush against the top mold plate 62 during the encapsulation process.

To further complicate matters, because of the pressures involved, a considerable amount of force is exerted between the top mold plate 62 and the bottom mold plate 64. Extreme care must be taken, then, to precisely control the thicknesses of the circuit die 20, spacer 30 and the adhesive layers 12, 14. If the device 10 is too thick, pressure exerted by the mold 60 upon the spacer 30 can cause the relatively fragile circuit die 20, and even the spacer 30, to break. On the other hand, if the device 10 is too thin, mold flash will form on the top surface 32 of the spacer 30, severely degrading the heat dissipating characteristics of the device 10. To provide for greater tolerances during the encapsulation process, then, a thin film 68 may be disposed over the inside surface of the top mold plate 62. The film 68 may serve both as a cushioning layer for the electrical device 10, and as a sealing layer to prevent mold flash. Because the molding process is single-sided, the bottom surface 49 does not develop any mold flash. Molding material 70 only flows over the top surface 41 of the substrate 40.

After the encapsulation process, molding material 70 fills the cavity 66, as shown in FIG. 2. A top surface 72 of the molding material 70 lies flush with the top surface 32 of the spacer 30, which, uncovered by any molding material 70, remains exposed to maximize thermal dissipation. Thereafter, the molding material 70 undergoes a curing process to harden the molding material 70. This is typically a heat curing process, which is performed in an oven. A solder ball mounting process is then performed to dispose a plurality of solder balls 80 onto respective conductive regions 44 of the bottom surface 49 of the substrate 40, as shown in FIG. 3. A singulation step separates the various FSBGA devices from each other to provide individual FSBGA packages, and then a heat spreader attachment step is performed.

As shown in FIG. 4, the heat spreader attachment step begins by laying down an adhesive layer 16 over the top surface 72 of the molding material 70 and the top surface 32 of the spacer 30. The adhesive 16 may be selected for superior thermal conductivity characteristics. As shown in FIG. 5, a heat spreader 90 is then attached to the adhesive layer 16. The heat spreader 90 is preferably made from a highly heat-conductive material, such as copper, and may be further provided fins or like protrusions to maximize its surface area. Because the heat spreader 90 is almost directly in contact with the top surface 32 of the spacer 30, but for the relatively thin adhesive layer 16, the FSBGA device 10 exhibits superior thermal dissipation characteristics. The adhesive layer 16 then undergoes a curing process, which is typically a thermal process performed in an oven, to secure the heat spreader 90 to the top surfaces 72, 32, and then a final laser marking step is performed to complete the FSBGA device 10.

The prior art encapsulation process requires that extremely tight tolerances be maintained on the thicknesses of the circuit die 20, spacer 30 and the adhesive layers 12, 14. Die thickness tolerances are typically between ±12.5 μm, as are those for the adhesive layers. This remains true even when the thin film 68 is used, since the film 68 may not provide a sufficient cushioning effect to prevent die cracking. Additionally, encapsulation with the thin film 68 is a more expensive procedure, which leads to higher production costs. Accordingly, there is an immediate need for an improved encapsulation process for circuit dies.

SUMMARY OF THE INVENTION

It is an object of the invention to provide an encapsulation method for a circuit die that provides a greater range of tolerances, and so simplifies the encapsulation process. It is another object of the invention to prevent damage to the circuit die, such as cracking, during an encapsulation process. It is yet another object to reduce the costs of the encapsulation process.

In accordance with these and other objectives, one aspect discloses a method for encapsulating a circuit die. The circuit die is disposed into a region defined by a mold. A molding material is then introduced into the region to encapsulate the circuit die. At least a portion of the molding material is subsequently removed from over a surface of the circuit die, creating a recessed region in the molding material. A heat spreader may then be disposed within the recessed region, as well as over the top surface of the molding material. The heat spreader may have a downset that substantially aligns with the recessed region.

In another aspect, an electronic device is disclosed that includes a substrate, external contacts electrically connected to the substrate, and a circuit die electrically connected to the substrate and having a first surface and a second surface. The second surface is mechanically coupled to the substrate. Molding material encapsulates at least a portion of the substrate and at least a portion of the circuit die. The molding material forms a recessed region around at least a portion of the first surface. The electronic device further includes a heat spreader having a downset that is disposed within the recessed region.

DETAILED DESCRIPTION

A packaging method for a circuit die, and related electronic device, is generally described herein, and will be explained with reference to the following non-limiting examples. In the explanations that follow, it should be understood that lists of materials, methods or the like are meant to be inclusive, rather than exclusive, and are intended simply to present indicative sub-sets of potentially much larger sets of related materials, methodologies or the like. Additionally, items shown in the figures are not to scale, but are instead drawn in a manner that simplifies the following description. Additionally, words of orientation such as "top," "bottom" or the like should not be taken with reference to the preferred orientation of a final product; these words are used merely with reference to the figures for ease of description.

Figure 1:
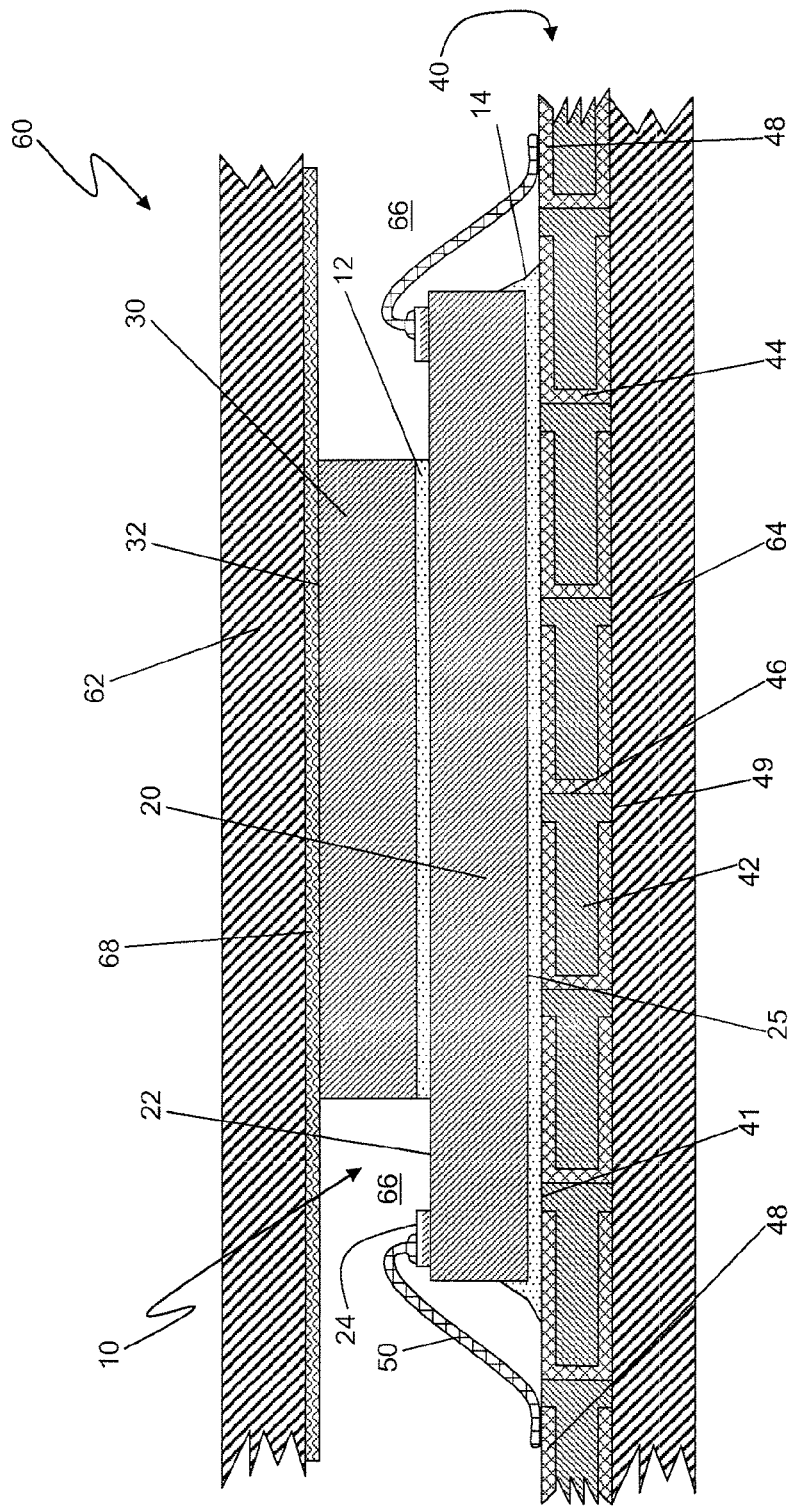
FIG. 1 illustrates a prior art encapsulation process for a circuit component.
Figure 2:
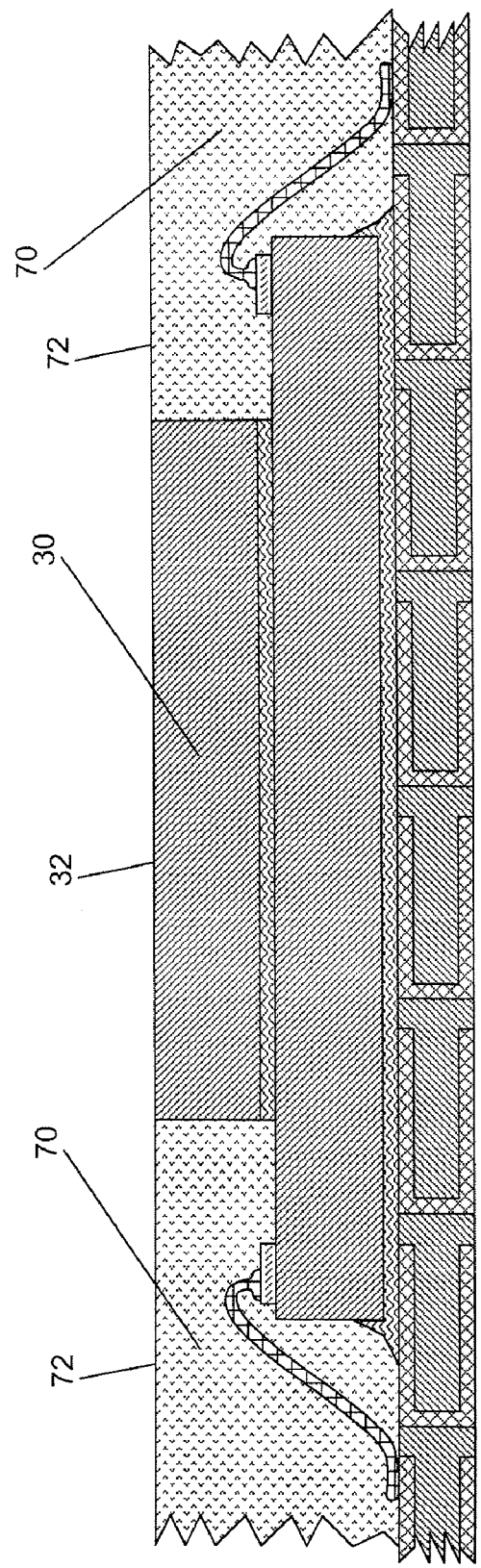
FIG. 2 shows the circuit component of FIG. 1 after completing the prior art encapsulation process.
Figure 3:
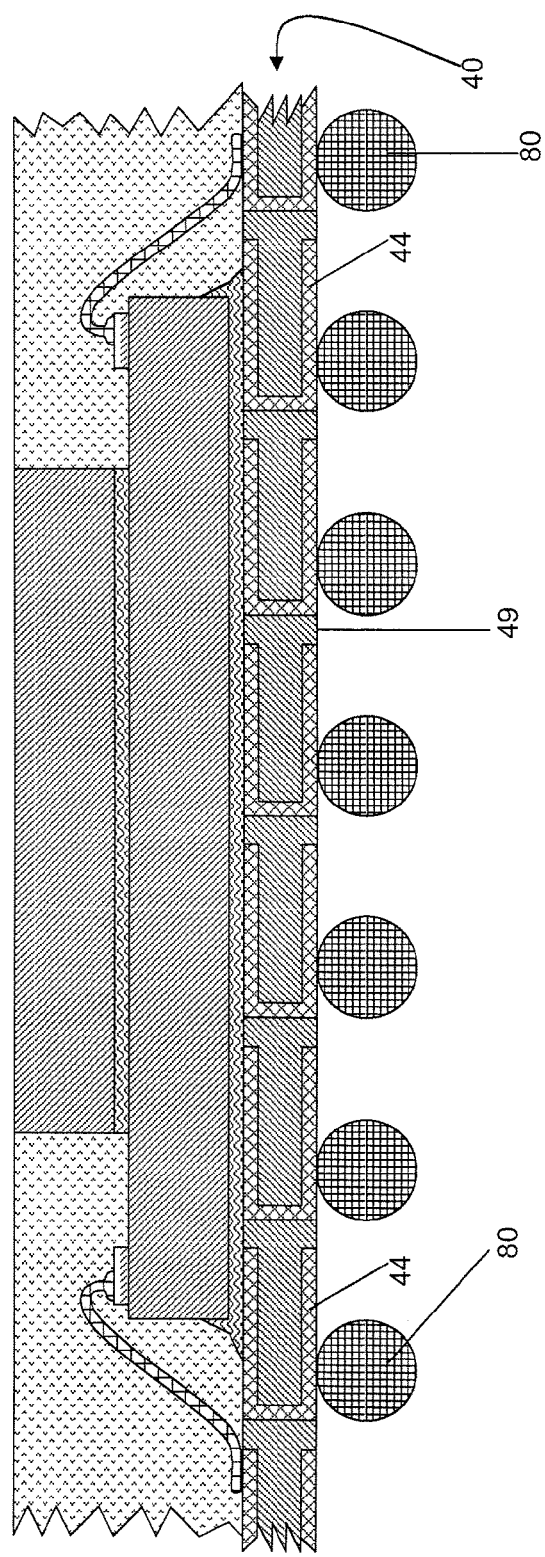
FIG. 3 shows the circuit component of FIG. 2 after completing a solder ball mounting process.
Figure 4:
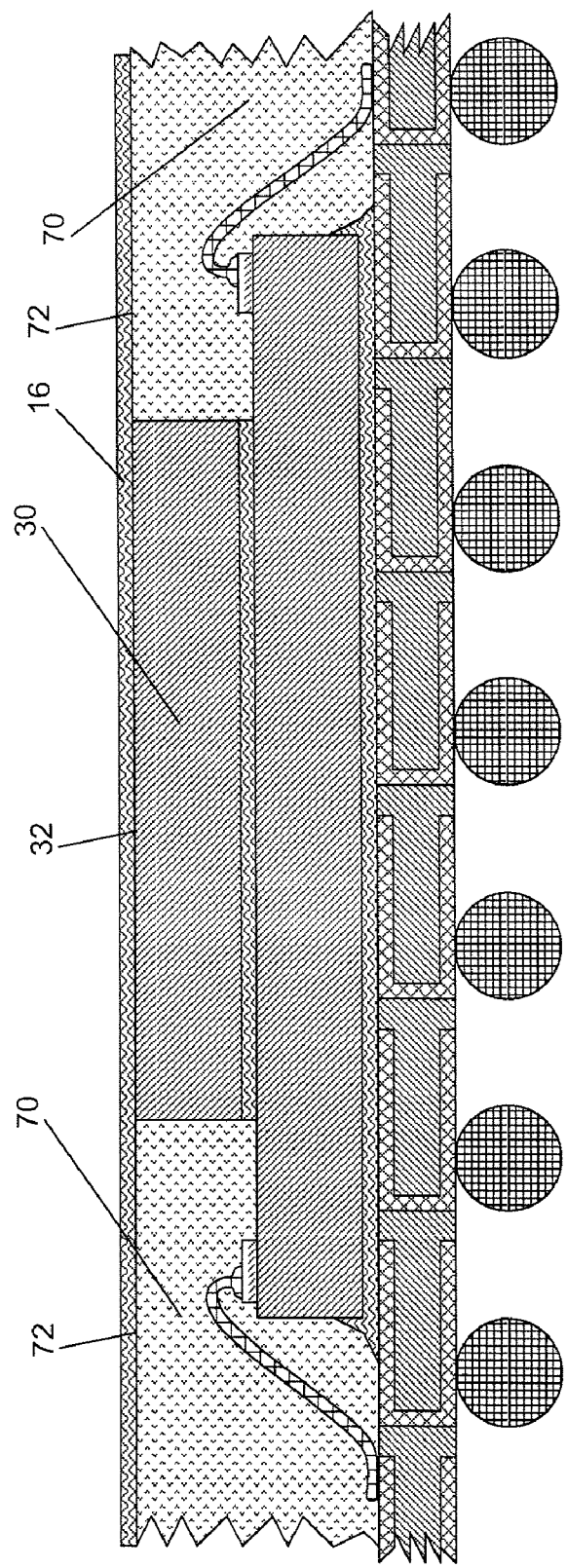
FIG. 4 illustrates a glue layer disposed over a top surface of the circuit component depicted in FIG. 3 in anticipation of a heat spreader attachment step.
Figure 5:
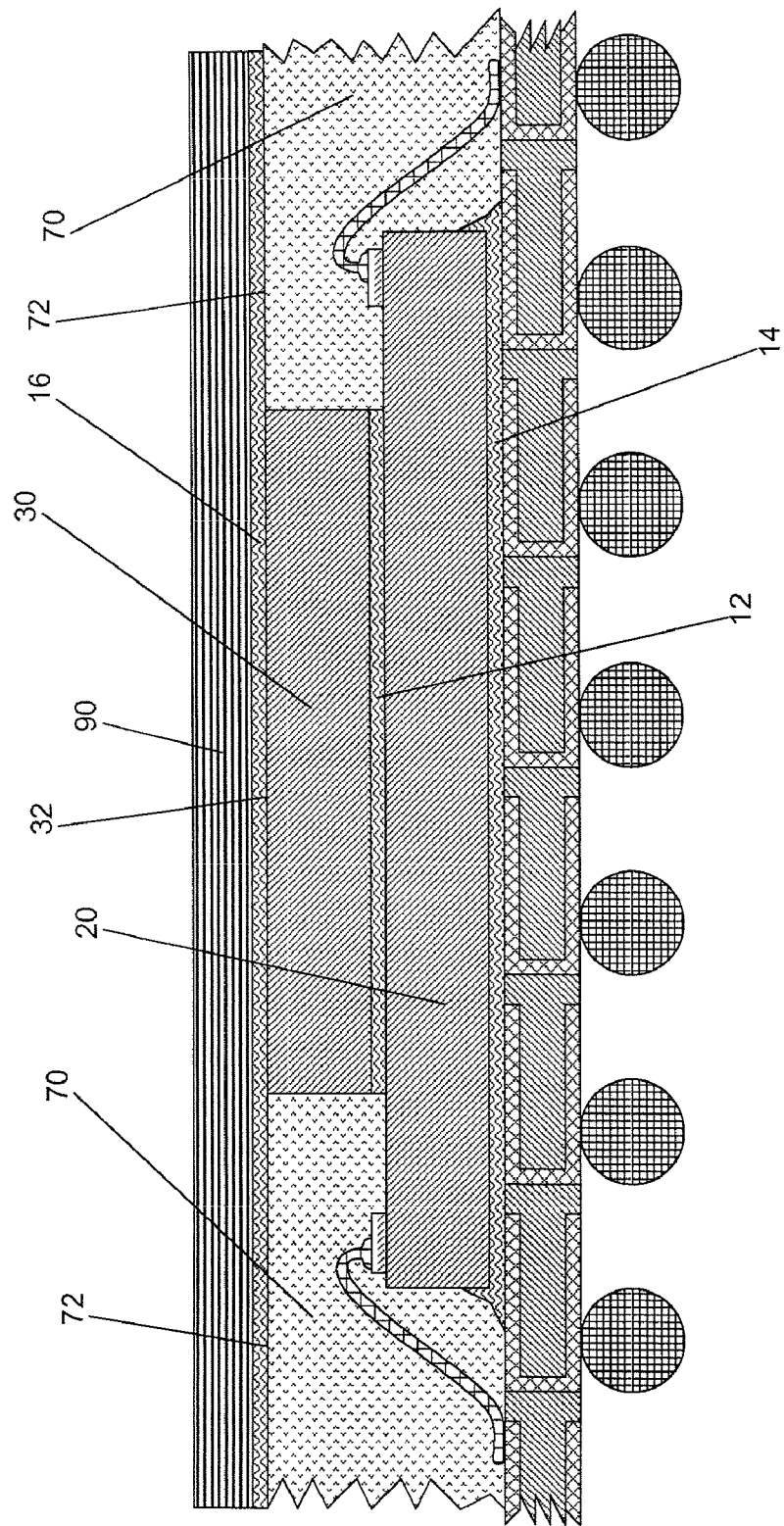
FIG. 5 shows the circuit component of FIG. 4 after the heat spreader attachment step.
Figure 6:
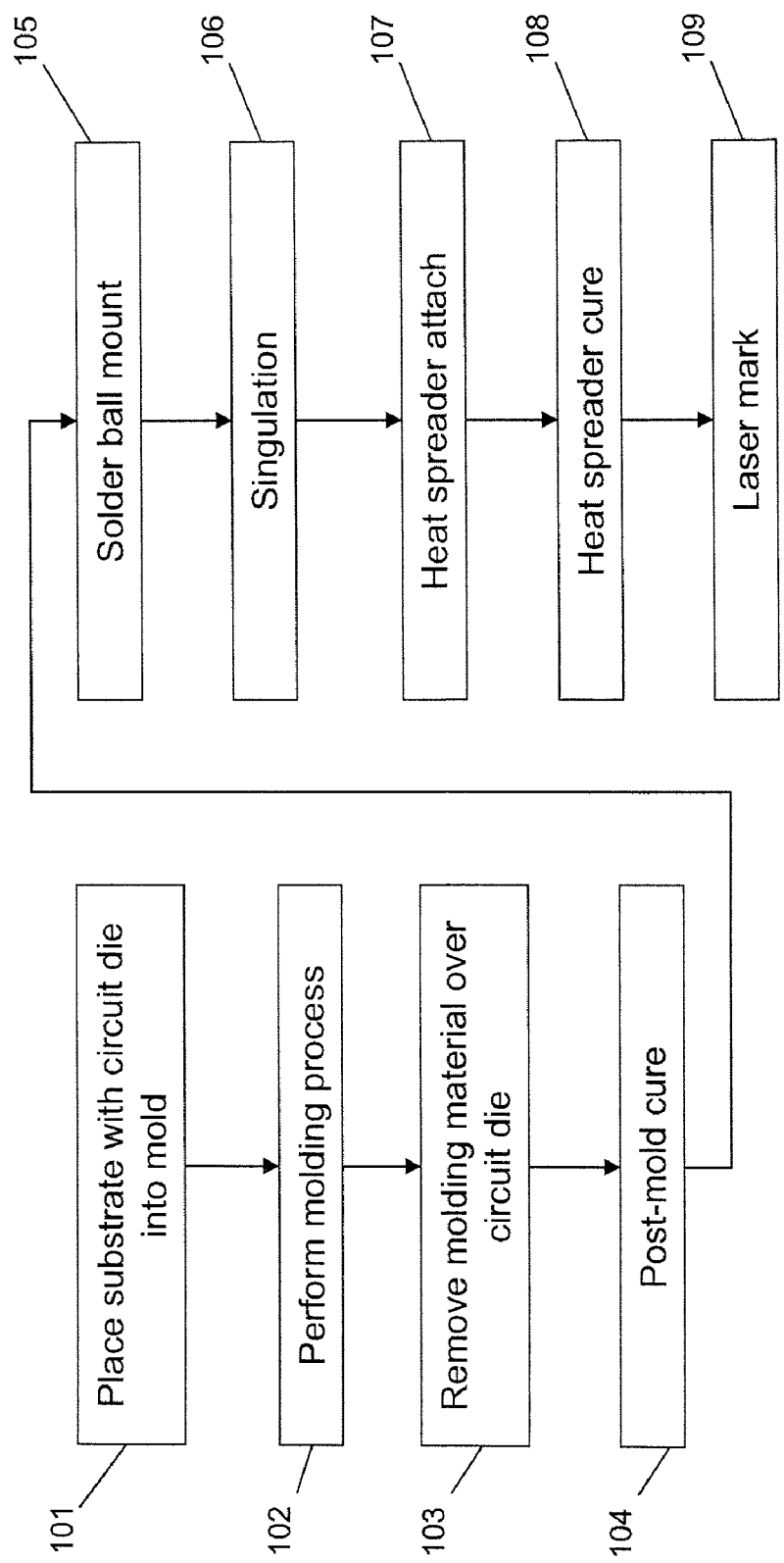
FIG. 6 is a flow chart of the present invention.
Figure 7:
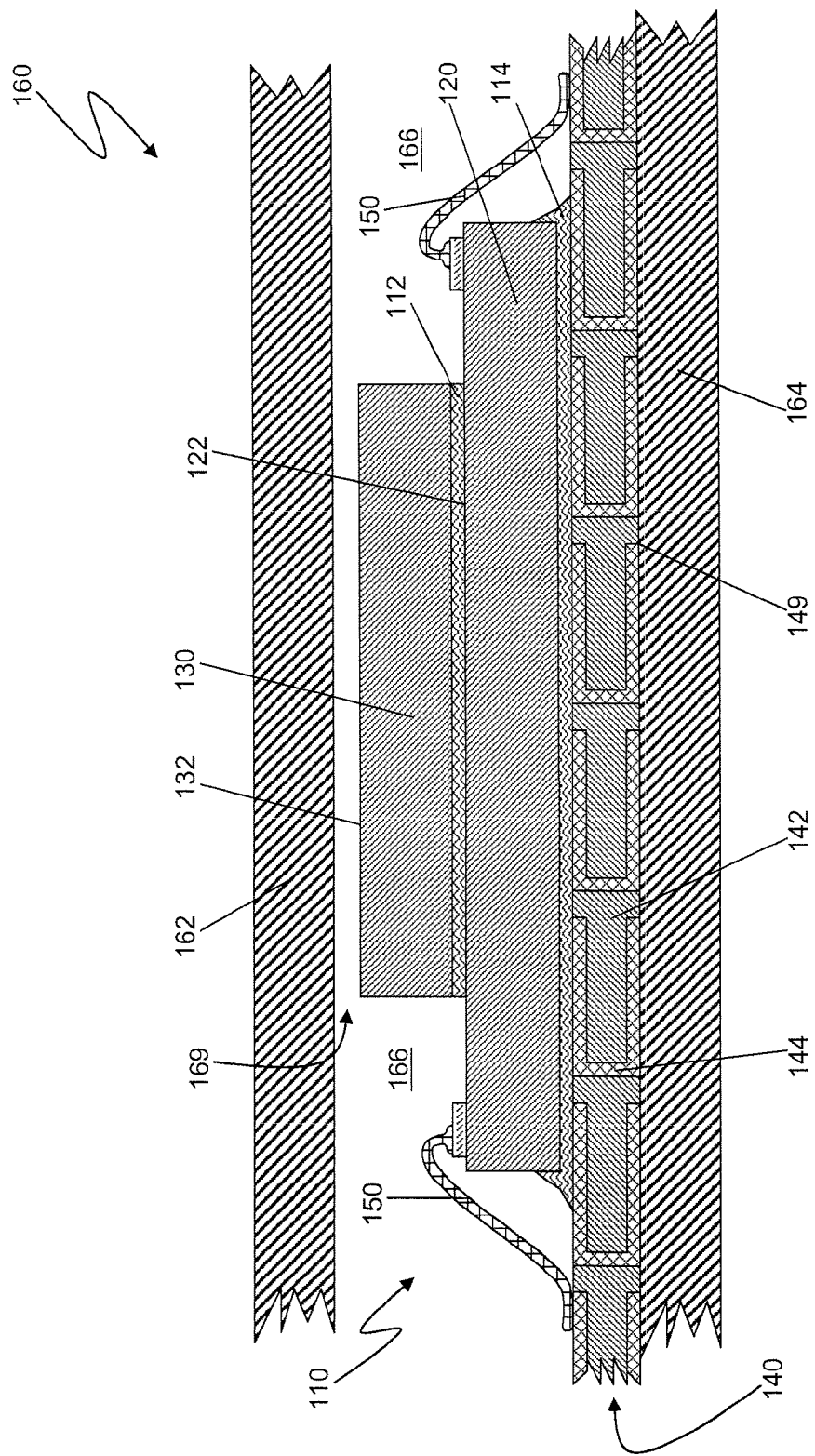
FIG. 7 illustrates a first embodiment encapsulation process for a circuit component.

A flow chart of one embodiment of the instant invention packaging method is shown in FIG. 6. With further reference to FIG. 7, a first embodiment packaging method begins, as indicated by step 101, by placing a circuit component 110 into a mold 160. The circuit component 110 is formed by standard methods known in the art, and may include a circuit die 120 bonded to a substrate 140 with a first adhesive layer 114, and a spacer 130 bonded to the active surface 122 of the circuit die 120 with a second adhesive layer 112. The spacer 130 may be, for example, a silicon spacer. Wire bonds 150 may electrically connect the active surface 122 of the circuit die 120 to the substrate 140. The substrate 140 may have a laminated structure, and includes conductive regions 144 and insulative regions 142, as known in the art. The circuit component 110 may thus provide the central electronics of, for example, an FSBGA module.

Figure 8:
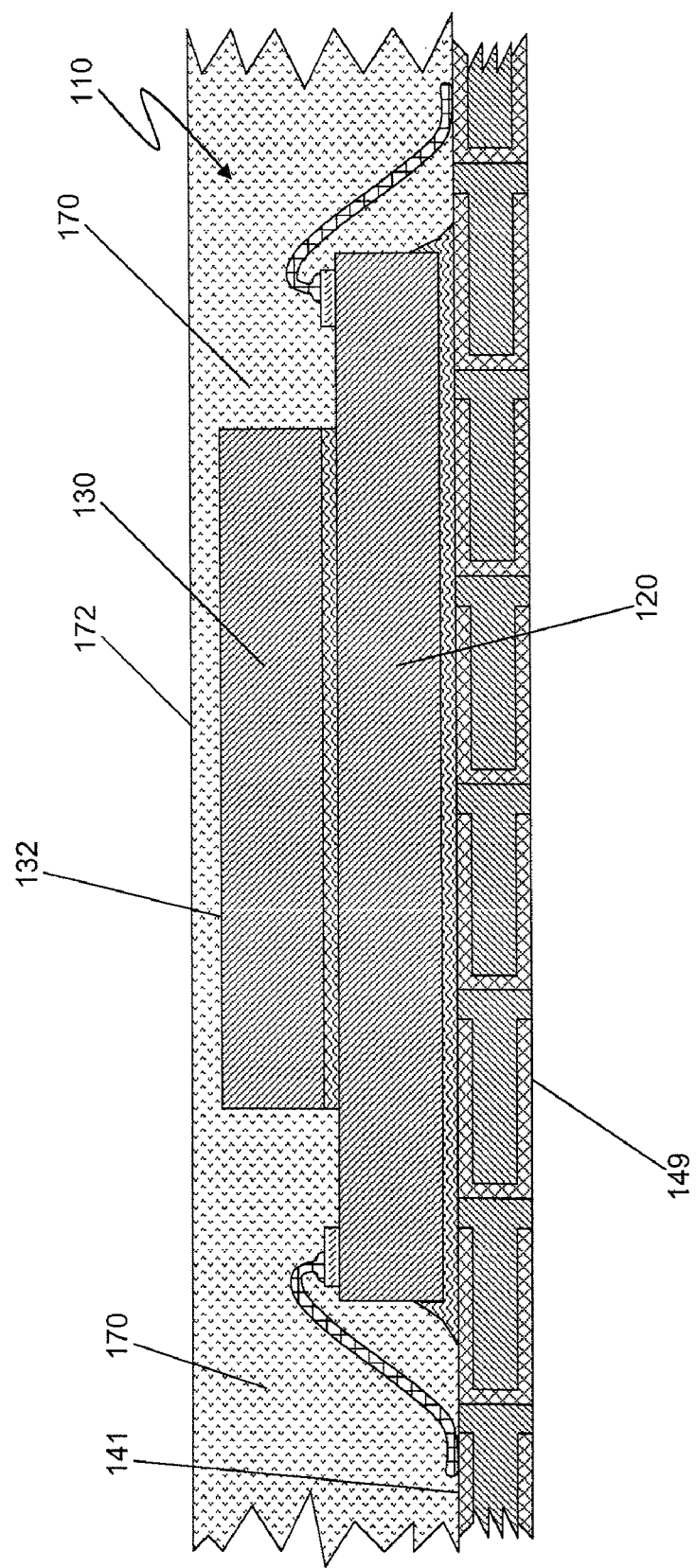
FIG. 8 shows the circuit component of FIG. 7 after completing the encapsulation process.

The circuit component 110 may be substantially identical to that of the prior art, but, because of the steps provided by the invention method, has less stringent tolerances on the thicknesses of the circuit die 120, spacer 130 and adhesive layers 112, 114. For example, the total tolerance for the device 110 may be increased to about ±150 µm, from ±25 µm of the prior art. When placed within the cavity 166 of the mold 160, the bottom surface 149 of the substrate 140 lies flush against the inside surface of the bottom mold plate 164. Bottom surface 149 may be secured to the bottom mold plate 164 with a combination of locating holes on the substrate 140 and locating pins on the bottom mold plate 164, as known in the art. As in the prior art encapsulation process, mold flash will not form over the bottom surface 149 of the substrate 140, as a single-sided molding process is performed. However, in contrast to the prior art, when the encapsulating process is performed and molding material 170, as indicated in FIG. 8, is introduced into the cavity 166, the top mold plate 162 does not contact the top surface 132 of the spacer 130. Instead, a gap 169 exists between the inner surface of the top mold plate 162 and the top surface 132 of the electronic device 110. The height of the gap 169 (i.e., the distance from the top surface 132 and the inner surface of the top mold plate 162) may be, for example, from 25 µm to 100 µm, and is preferably between 25 µm and 75 µm. Because of the gap 169, there is no danger of the top mold plate 162 contacting, and thus breaking, the spacer 130, and, by extension, the circuit die 120. Greater tolerances in the respective thicknesses of the circuit die 120, spacer 130, and adhesive layers 112, 114, are thus made possible, in proportion to the height of the gap 169. Additionally, because the gap 169 is deliberately introduced into the molding process, there is no need to provide a thin film to cover the inner surface of the top mold plate 162. A conventional molding process can be performed, without the need for more expensive film-assisted technologies.

As indicated in step 102, a molding process is performed, in which molding material 170 is introduced into the cavity regions 166 by any suitable method known in the art, yielding an encapsulated product depicted in FIG. 8. As shown, the molding material 170 forms a continuous top surface 172 that covers and fully encapsulates both the circuit die 120, the spacer 130, and at least a portion of the top surface 141 of the substrate 140. However, little, and ideally no, molding material 170 covers the bottom surface 149 of the substrate 140. The thickness of the molding material 170 over the top surface 132 of the spacer 130 is substantially equal to the height of the gap 169 indicated in FIG. 7, and may be, for example, from 25 µm to 100 µm. The molding material 170 may be made from any suitable substance, such as epoxy molding compound.

Figure 9:
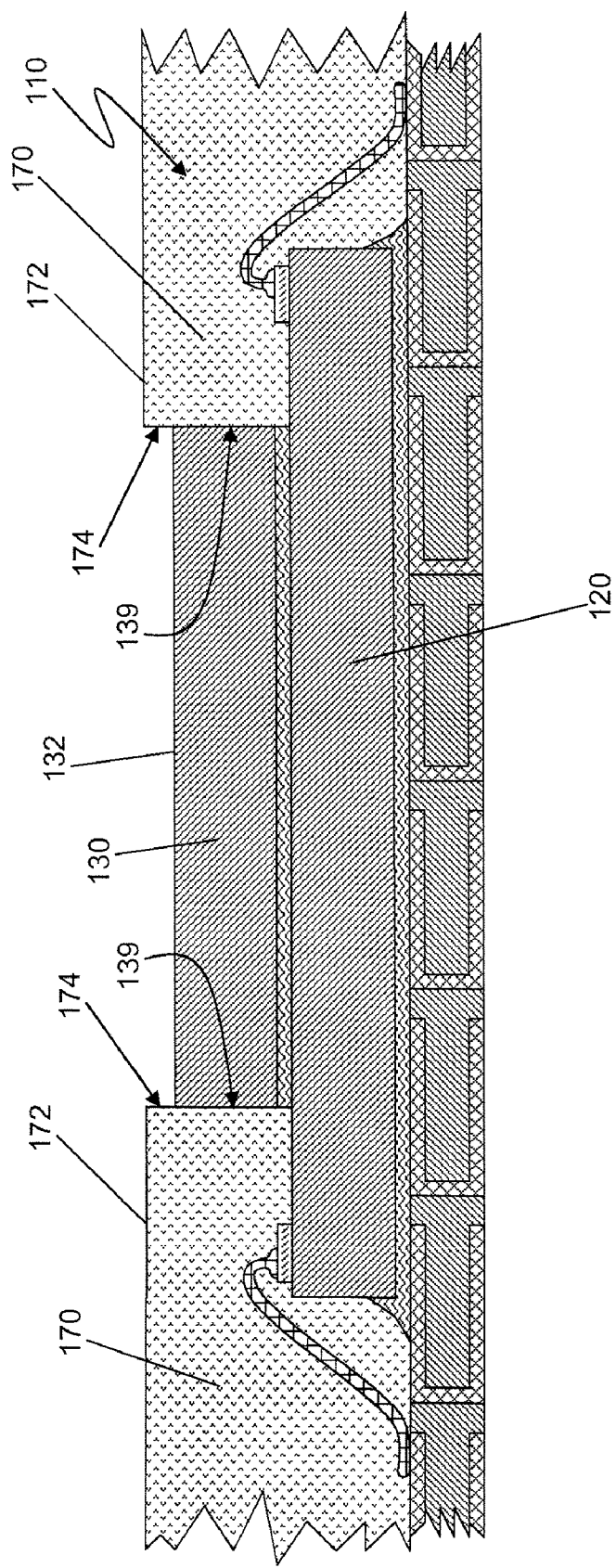
FIG. 9 shows the circuit component of FIG. 8 after completing a molding material removal step.

When the encapsulated circuit component 110 is removed from the mold 160, the molding material 170 is substantially uncured. The molding material 170 may thus be relatively soft, in comparison to its cured state, and so may be more easily removed in a subsequent step 103. As indicated in step 103, at least a portion of the molding material 170 that forms the top surface 172, and which is disposed over the top, exposable surface 132 of the spacer 130, and by extension over the circuit die 120, is removed. It should be noted, however, that in other embodiments the molding material 170 may be removed after curing, and thus the order of steps 103 and 104 may be swapped. Removal of the molding material 170 may expose at least a portion of the top surface 132 of the spacer 130, which may be designed to tolerate such exposures. In certain embodiments all, or substantially all, of the molding material 170 over the top surface 132 is removed, as shown in FIG. 9, so as to maximize the thermal performance of the resultant FSBGA device. Hence much, or even substantially all, of the molding material over the circuit die 120 may be removed. A recessed region 174 is thereby created in the top surface 172 of the molding material 170, which is aligned with, and disposed over, the top surface 132, and by extension, over the circuit die 120. The recessed region 174 in the molding material 170 may partially expose the top surface 132, and in certain embodiments may fully expose the top surface 132. As a general matter, the more molding material 170 that is removed from over the top surface 132 the better the thermal characteristics of the electronic device. The spacer 130 may remain, however, partially encapsulated by the molding material 170, insofar as sidewalls 139 of the spacer 130 are covered by the molding material 170.

Any suitable method may be utilized to remove the molding material 170. Removal can be effected by, but is not limited to, laser radiation, acid etching and mechanical grinding. In one embodiment, a laser is utilized to remove the molding material 170. This laser may be the same device that is used in a subsequent laser marking step 109. For example, a Yttrium aluminium garnet (YAG) laser may be employed, with a power level of about 100 W and a wavelength of about 1064 nm, using a surface scanning technique over the top surface 172 of the molding material 170. Laser scanning may be achieved with a beam expanding telescope for uniform laser etching. Thermal energy imparted by the laser radiation causes the exposed molding material 170 to vaporize. However, because the spacer 130 may be, for example, a silicon chip, the spacer 130 may have a relatively high melting point, such as around 1410° C. The laser power is thus high enough to remove the molding compound 170, which may have a decomposition temperature from about 330° C. to about 390° C., but is low enough to not cause significant damage to the spacer 130. It is noted that if removal of the molding material 170 is performed before the material 170 has substantially cured, lower power levels may be employed by the laser to effect removal. However, if the molding material 170 has substantially cured before the removal process is performed, then a higher laser powers, and longer exposure times, may be needed. Differences in pre-mold and post-mold removal parameters may depend upon the type of compound used for the molding material 170.

Figure 10:
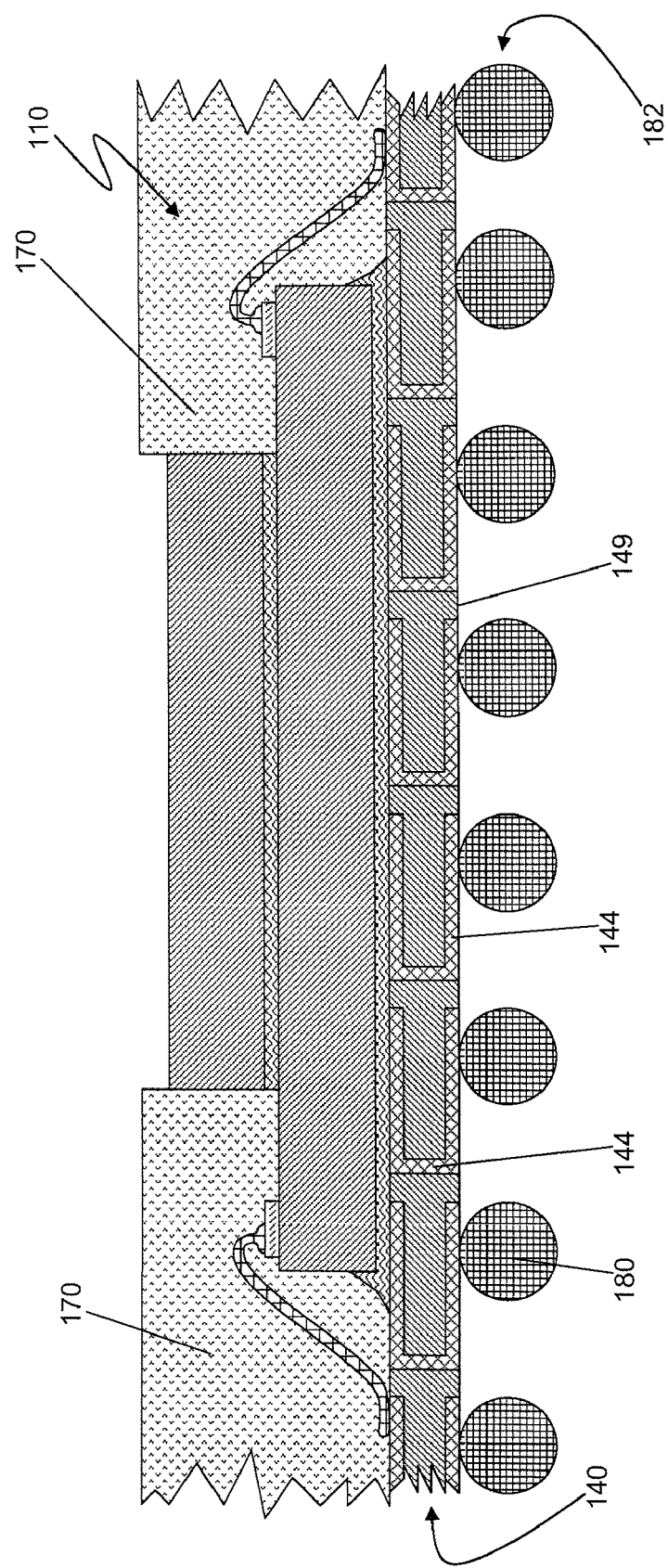
FIG. 10 shows the circuit component of FIG. 9 after completing a solder ball mounting process.

In certain embodiments, subsequent to the removal of the molding material 170 in step 103, the remaining molding material 170 undergoes a curing process, as indicated by step 104. The curing process 104 makes the remaining molding material 170 harder, and may, for example, be performed in an oven at around 175° C. for about 2 to 6 hours. As previously indicated, in alternative embodiments, the post-mold curing process 104 is performed before the molding material removal step 103, although longer grinding times, different acid bath compositions or higher laser powers may be required. As indicated in step 105, and shown in FIG. 10, a solder ball mounting procedure is performed, as known in the art, to attach a plurality of solder balls 180 to the conductive regions 144 of the bottom surface 149 of the substrate 140. These solder balls 180 may form, for example, the ball grid array (BGA) 182 of the FSBGA circuit device, and provide the external contacts of the electronic device to electrically connect the component 110 with external circuitry. Any suitable method known in the art may be utilized to form the solder balls 180, such as the use of an automated ball mount machine to transfer the solder balls 180 through vacuum assisted pins.

At the end of the solder ball 180 mounting step 105, although not shown in the figures, what is then present is a relatively large, contiguous package of several FSBGA devices, each having a respective circuit component 110 and BGA 182, and which are bonded together with molding material 170 from a single molding step 102. In step 106, the various devices are separated from each other in a singulation process, as known in the art, yielding individual devices that separately undergo subsequent heat spreader attachment and laser marking steps. Singulation may be performed with a mechanical dicing saw. Singulation may also be performed, for example, with a water jet or a laser.

Figure 11:
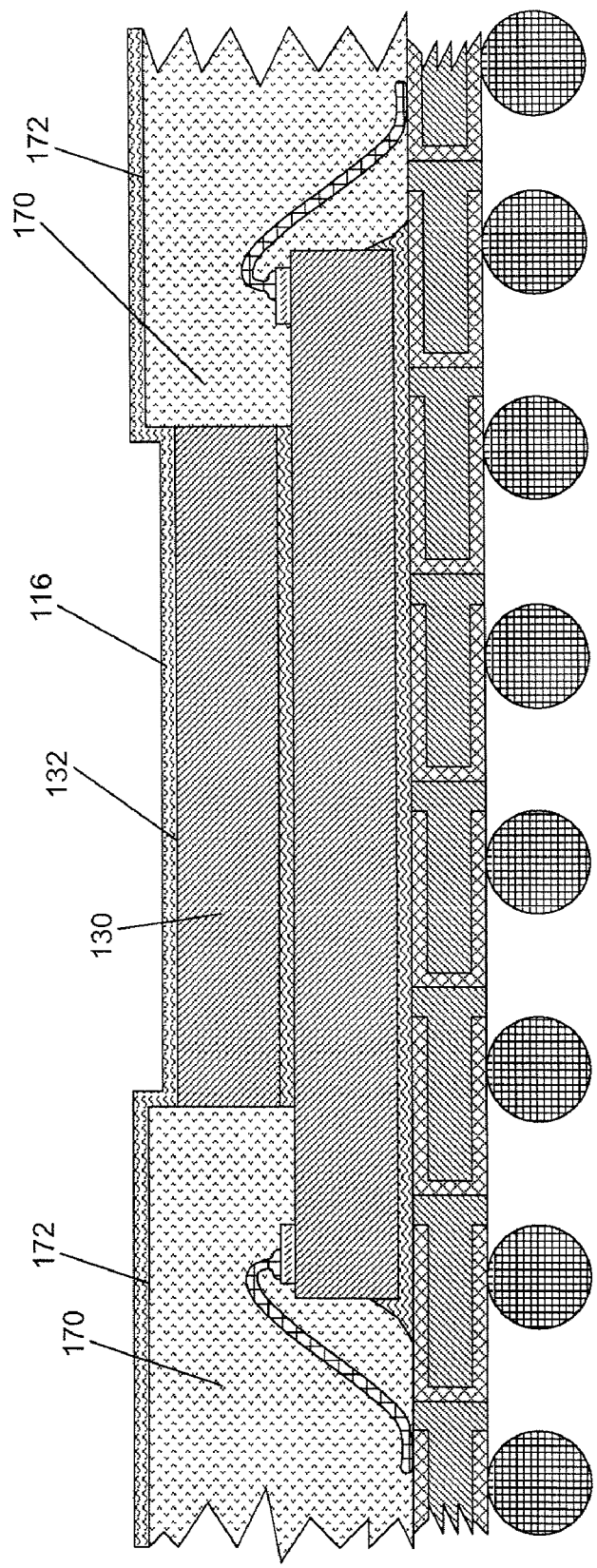
FIG. 11 illustrates a glue layer disposed over a top surface of the circuit component depicted in FIG. 10 in anticipation of a heat spreader attachment step.
Figure 12A:
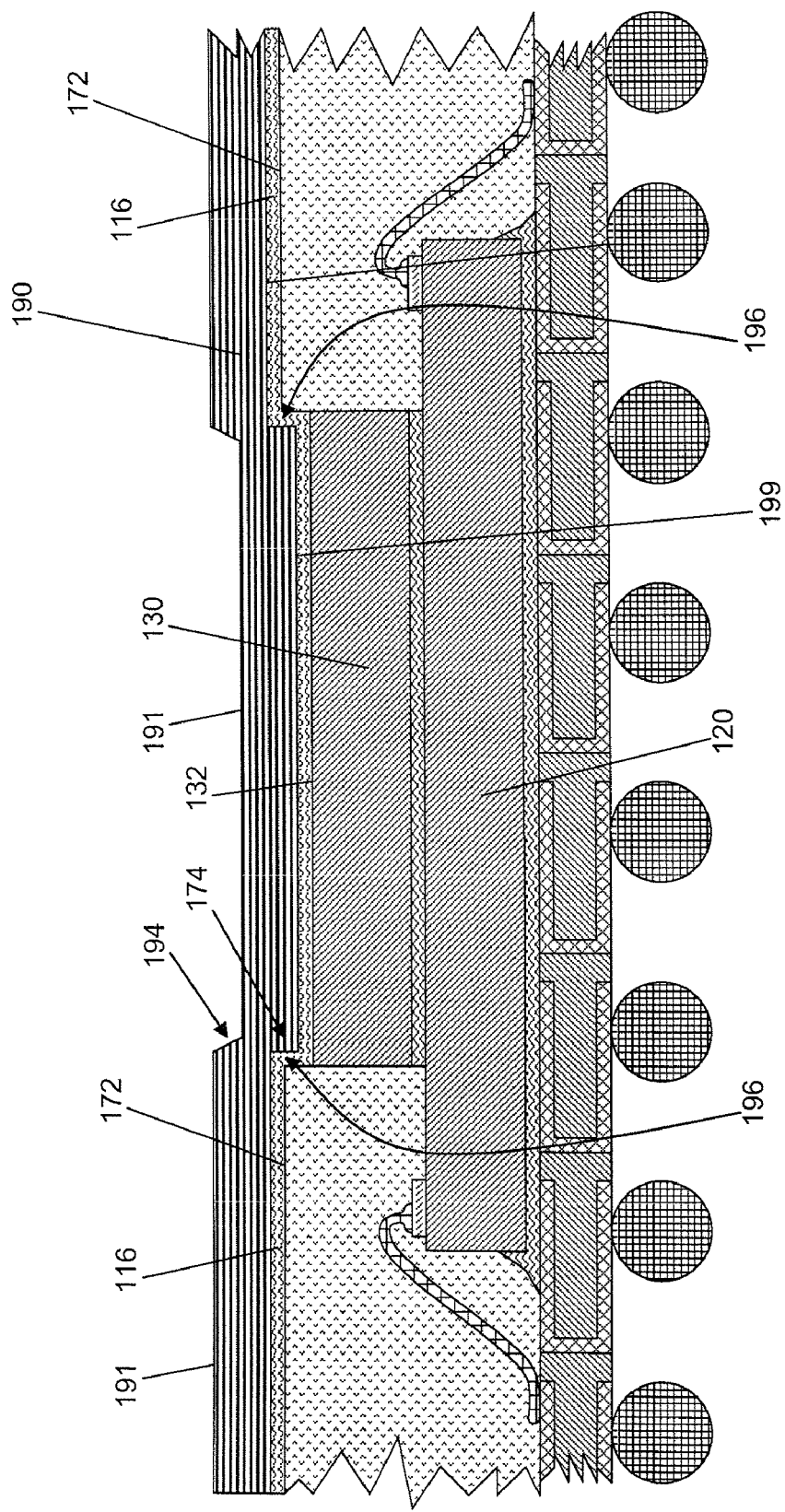
FIG. 12A shows the circuit component of FIG. 11 with an attached first embodiment heat spreader having a downset.
Figure 12B:
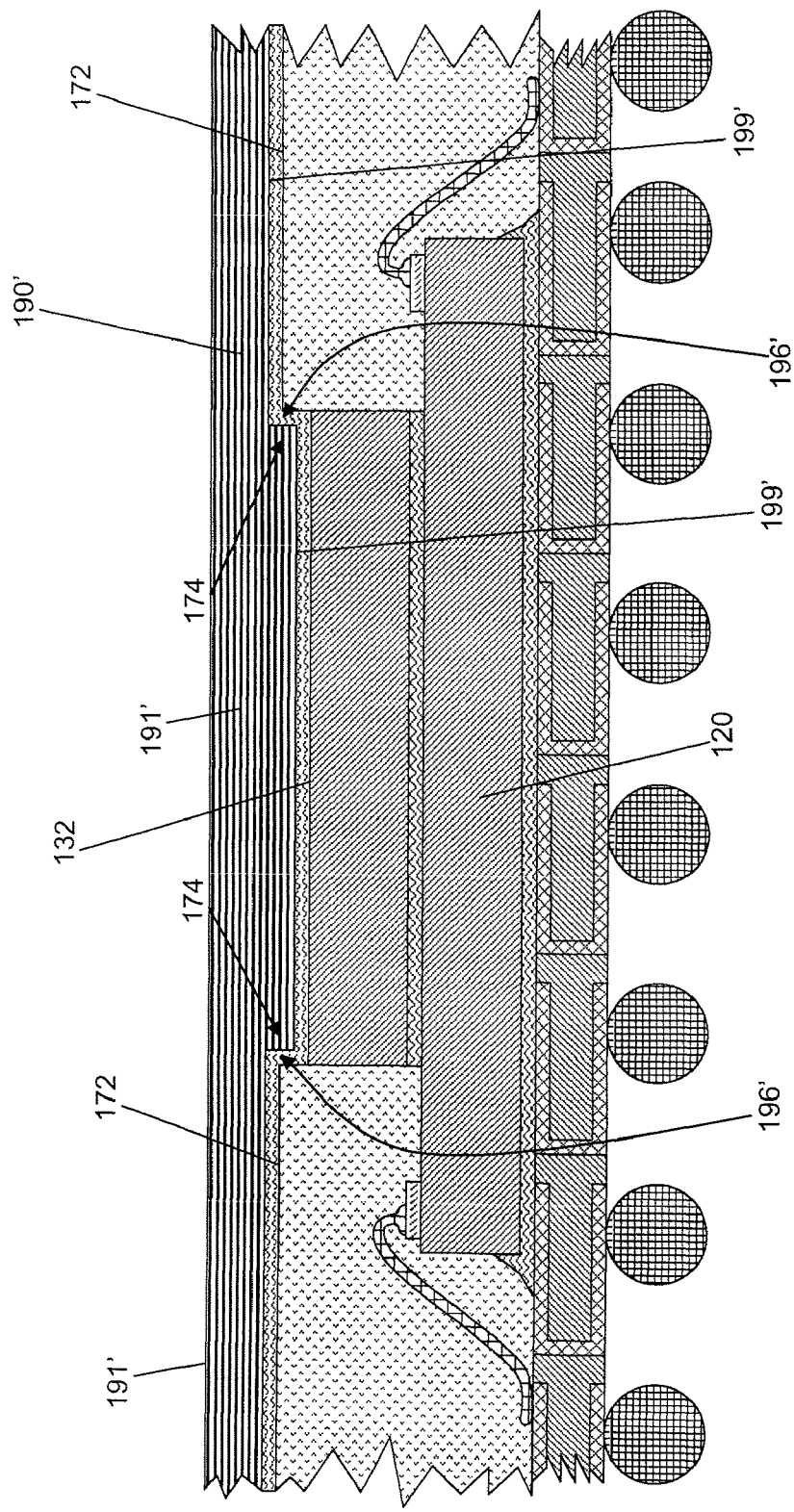
FIG. 12B shows the circuit component of FIG. 11 with an attached second embodiment heat spreader having a downset.

A heat spreader attachment step 107 may begin, as shown in FIG. 11, with the deposition of an adhesive layer 116 over the exposed top surface 132 of the spacer 130 and the remaining top surface 172 of the molding material 170. The adhesive layer 116 may be selected to have superior thermal conductivity properties, such as around 3 W/mK, and may include such adhesives as thermal grease or other adhesives with, for example, high thermal conductivities. Adhesive layer 116 may be formed by way of a dispenser with a dispensing tip, and have a thickness that can range from 25 µm to 100 µm. Then, as shown in FIG. 12A, a heat spreader 190 is disposed over, and attaches to, the adhesive layer 116, and which is particularly disposed over the recessed region 174 in the molding material 170. The top surface 191 of the heat spreader 190 may have a downset 194 that is sized and positioned to align with the recessed region 174. Similarly, the bottom surface 199 of the heat spreader 190 has a downset 196 that is shaped to fill or layer over the recessed region 174, while the remainder of the bottom surface 199 is aligned with the top surface 172 of the molding material 170. Only the relatively thin adhesive layer 116 separates the bottom surface 199 of the heat spreader 190 from the top surface 172 of the molding material 170, and from the top surface 132 of the spacer 130, thus maximizing thermal conduction between the heat spreader 190, spacer 130 and circuit die 120. An alternative embodiment is shown in FIG. 12B, in which the top surface 191' of a heat spreader 190' has no downset, but the bottom surface 199' has a downset 196' that aligns with and is disposed within and over the recessed region 174.

Steps 108 and 109 complete the fabrication of the FSBGA device. In step 108, the adhesive layer 116 is cured, so as to secure the heat spreader 190, 190' over the top surfaces 132, 172 of the FSBGA device. A heat cure, for example, may be used to cure the adhesive layer 116. In step 109, a laser may be used to etch identification markings or the like upon the heat spreader 190, 190'. The laser so used may be the same laser that is used in step 103 to remove the molding material 170 over the circuit die 120.

Figure 13:
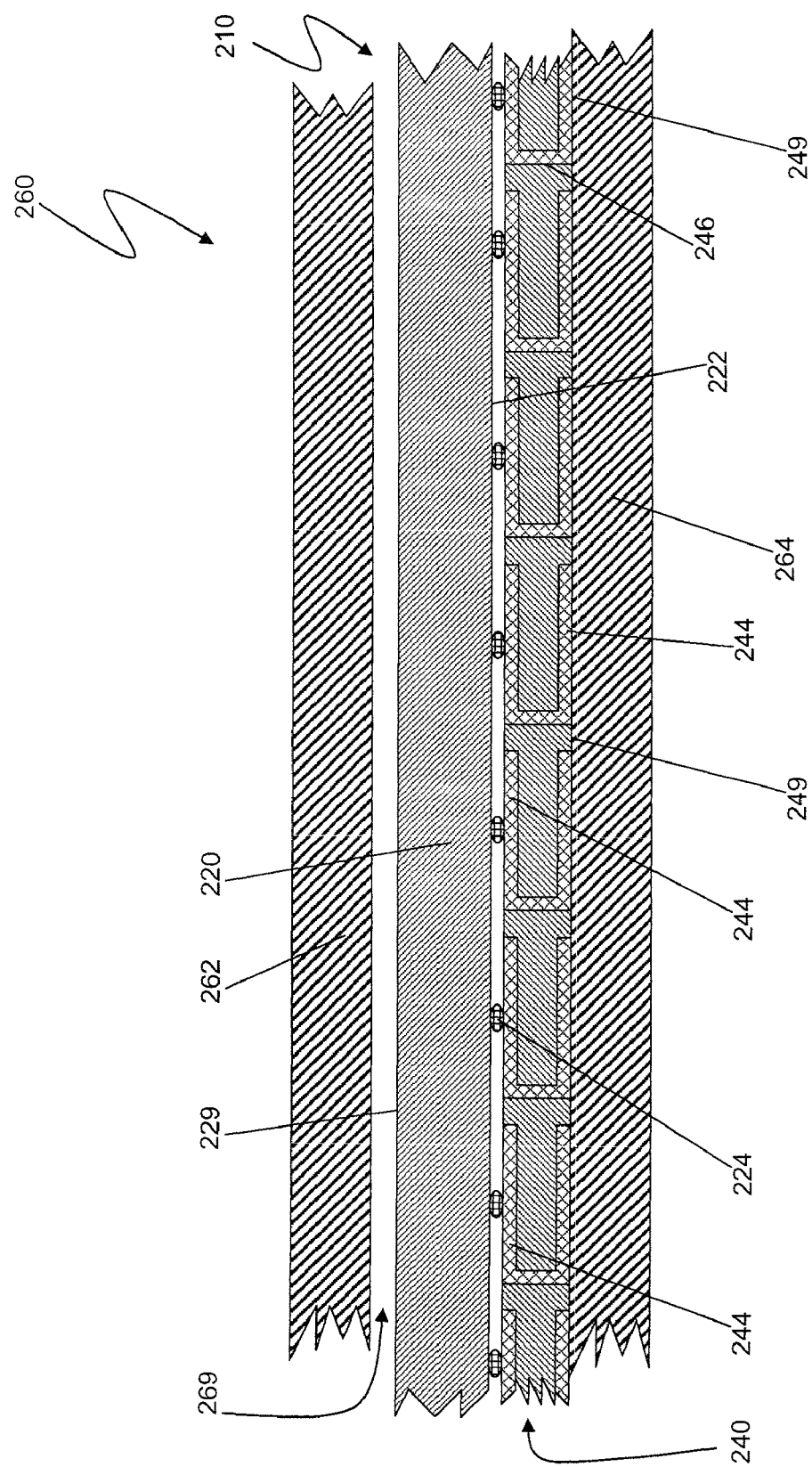
FIG. 13 illustrates a second embodiment encapsulation process for a circuit component.

The instant invention is not limited to only FSBGA devices. On the contrary, the methods of the instant invention may be applied to any circuit die in which it is desired that at least a portion of a surface of the die or spacer be exposed from the encapsulating material. For example, with reference to FIG. 13, a standard flip-chip circuit component 210 used to provide a plastic ball grid array (PBGA) is shown disposed within a mold 260. The circuit component 210 may be any such standard component as provided by the art, and includes a circuit die 220 with an active surface 222 electrically bonded to contacts 244 on a substrate 240 by way of solder balls 224 or the like. Solder balls 224 may be made, for example, from a tin-lead or tin-silver-copper alloy. The laminated substrate 240 permits corresponding electrical contacts 244 on the bottom surface 249 of the substrate 240 to electrically connect to the active surface 222 of the circuit die 220.

Figure 14:
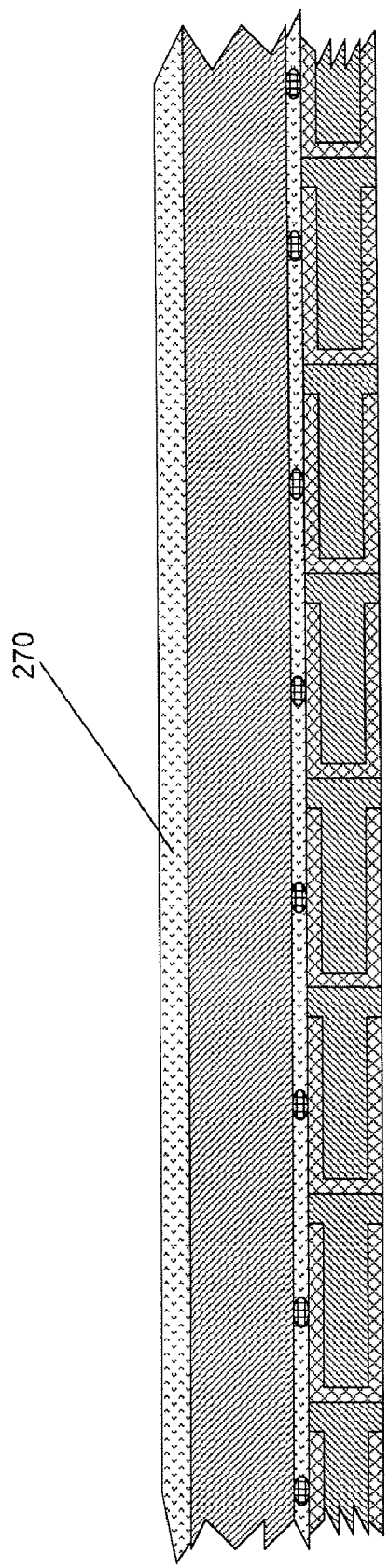
FIG. 14 shows the circuit component of FIG. 13 after completing the encapsulation process.
Figure 15:
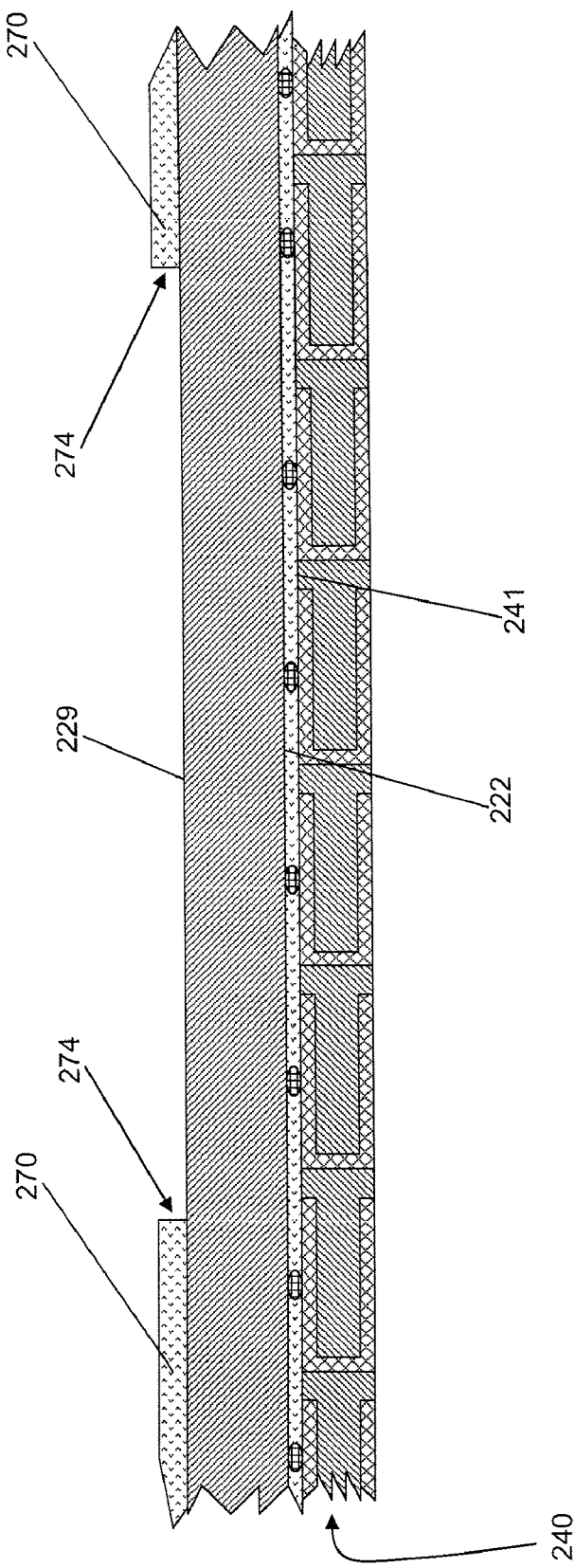
FIG. 15 shows the circuit component of FIG. 14 after completing a molding material removal step.

When placed within the mold 260, the bottom surface 249 of the substrate 240 lies flush against the bottom mold plate 264. The top mold plate 262 is spaced from the bottom mold plate 264 so that a gap 269 exists between the backside surface 229 of the circuit die 220 and the inner surface of the top mold plate 262. The gap 269 may have a width, for example, from 25 µm to 100 µm. A molding process is then performed, which fills the cavity regions within the mold 260, and in particular fills the gap 269 with molding material 270, as shown in FIG. 14. In one embodiment, before the molding material 270 has substantially cured, a removal procedure is performed to remove at least a portion of the molding material 270 from over the backside surface 229 of the circuit die 220, and thereby create a recessed region 274 in the molding material 270, as shown in FIG. 15. In other embodiments, the molding material 270 may be removed after curing. In either event, the recessed region 274 may cause some or all of the backside 229 of the circuit die 220 to be exposed. However, it may be noted that even if all of the molding material 270 is removed from the backside surface 229, the circuit die 220 may still be partially encapsulated by molding material 270, insofar as molding material 270 may exist between the active surface 222 of the circuit die 220 and the top surface 241 of the substrate 240. Additionally, molding material 270 may cover sidewalls (not shown) of the circuit die 220. Any suitable method may be employed to remove the molding material 270 to form the recessed region 274 over the circuit die 220, such as the methods discussed with reference to the previous embodiments. For example, a laser etching procedure may be employed to remove the molding material 270.

Figure 16:
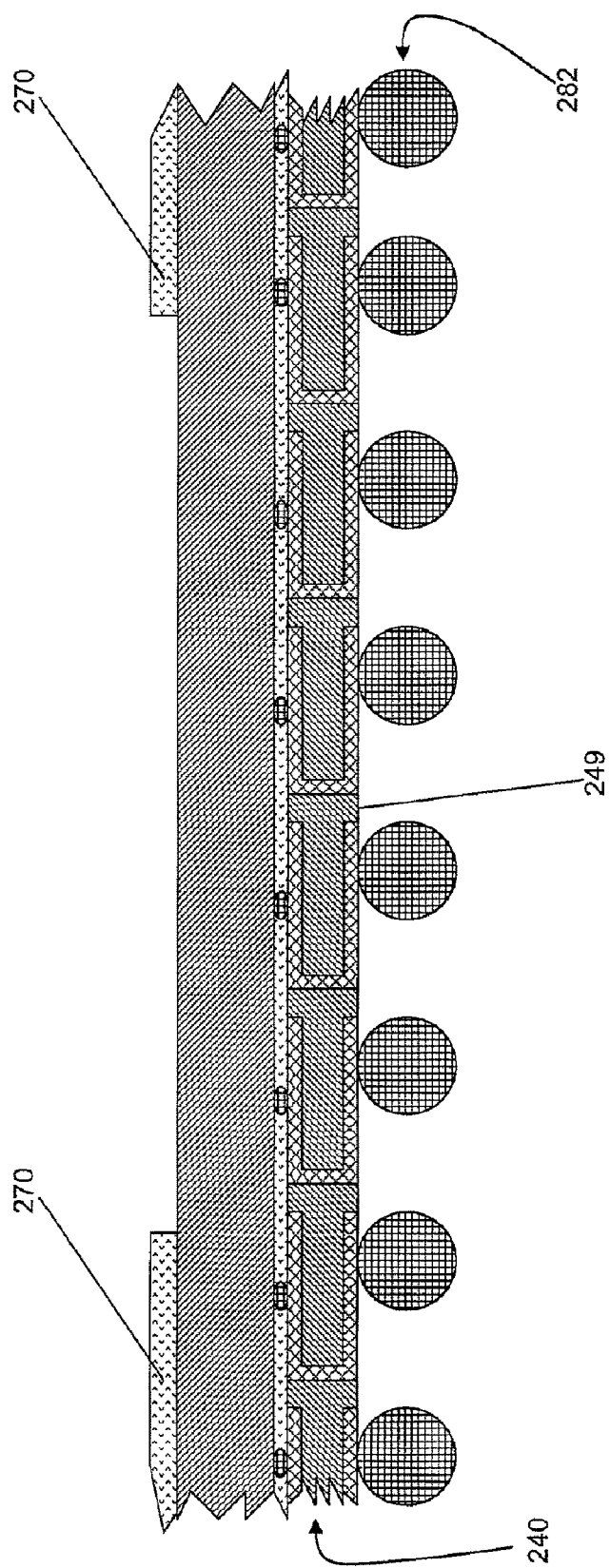
FIG. 16 shows the circuit component of FIG. 15 after completing a solder ball mounting process.
Figure 17:
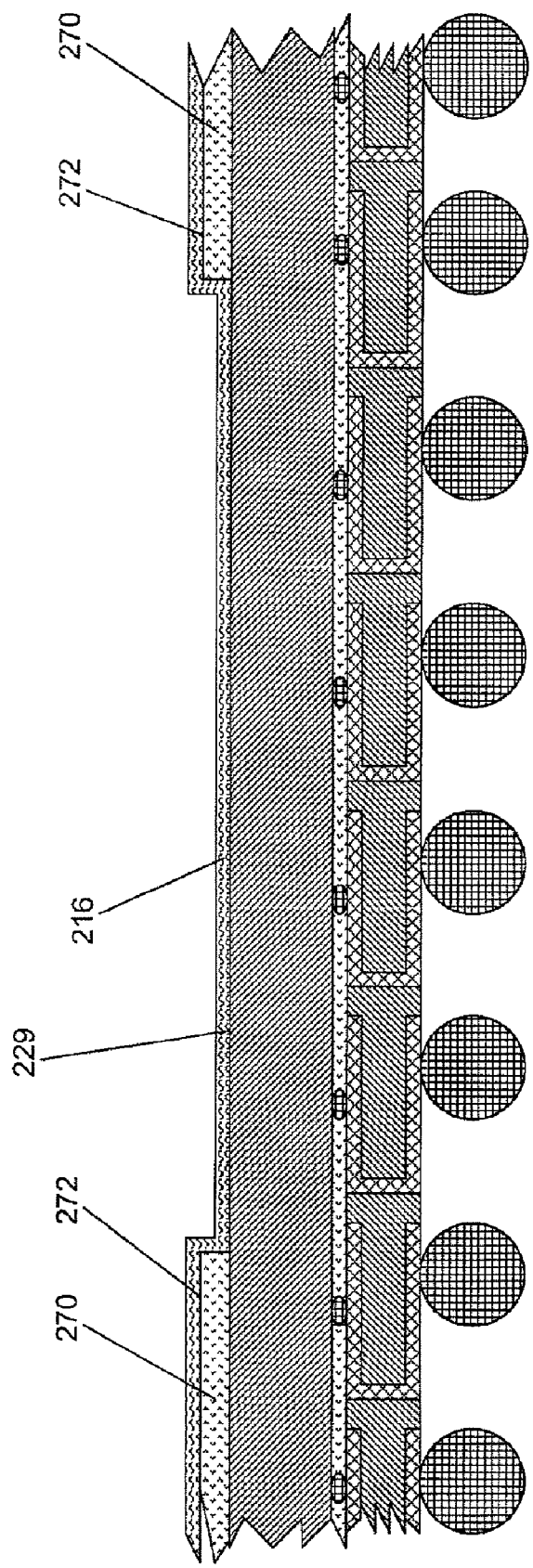
FIG. 17 illustrates a glue layer disposed over a top surface of the circuit component depicted in FIG. 16 in anticipation of a heat spreader attachment step.
Figure 18:
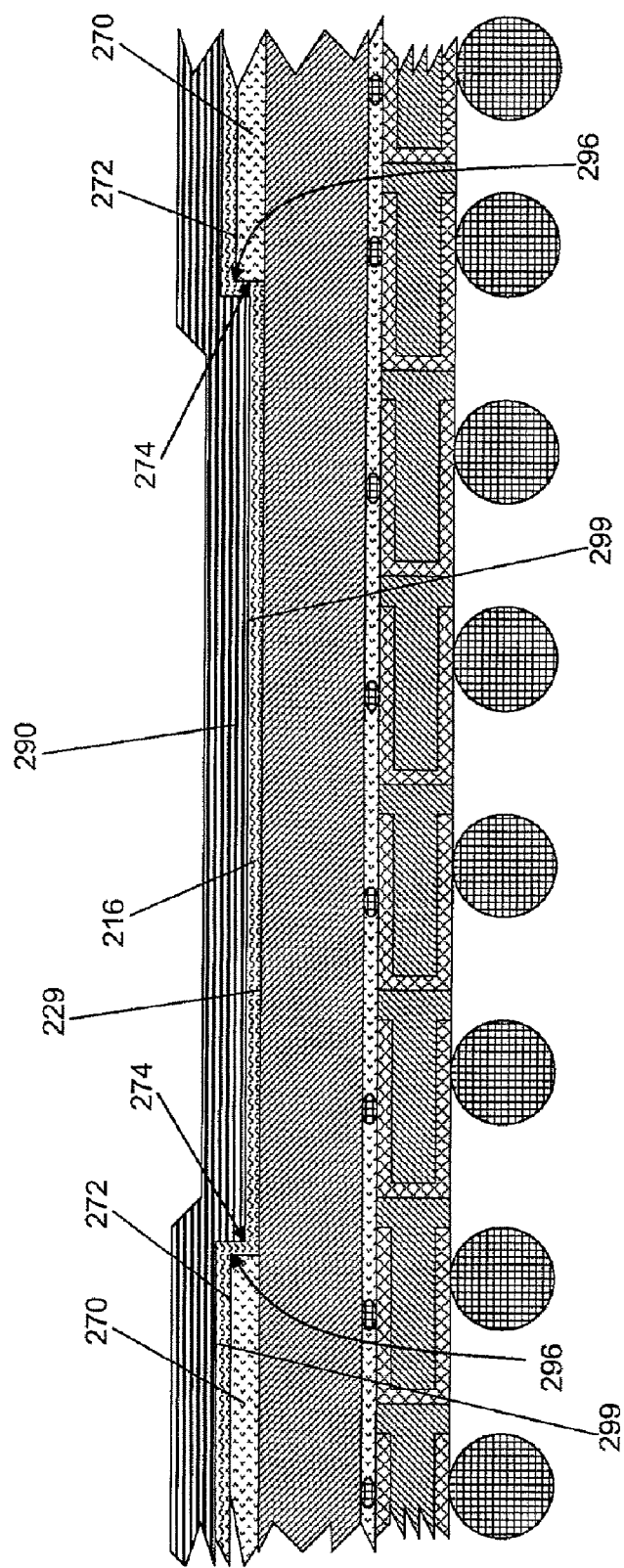
FIG. 18 shows the circuit component of FIG. 17 with an attached heat spreader having a downset.

The remaining molding material 270 is cured, which may, for example, be done in an oven at around 175° C. for about 2 to 6 hours, and then, as shown in FIG. 16, a solder ball mounting procedure is performed to form a ball grid array 282 on the bottom surface 249 of the substrate 240. After singulation, a heat spreader may be attached to the individualized PBGA packages. As shown in FIG. 17, an adhesive layer 216 may be disposed over the top surface 272 of the molding material 270, and over the exposed backside surface 229 of the circuit die 220. Thereafter, as shown in FIG. 18, a bottom surface 299 of a heat spreader 290 may be attached to the adhesive layer 216. The bottom surface 299 may have a downset 296 that aligns with, and is disposed within, the recessed region 274. The bottom surface 299 may thus follow the contours of the top surface 272 of the molding material 270, as well as the exposed surface 229 of the circuit die 220. The adhesive layer 216 may then undergo a conventional curing process, and finally the entire PBGA package may undergo laser marking.

By introducing a gap between the top mold plate and the top surface of the circuit component, the instant invention prevents any accidental crushing or breakage of the circuit die by the mold. This helps to improve yields. The tolerances on the thickness of the circuit component are greatly relaxed, easing production costs, and thin-film molding techniques do not need to be employed, further reducing production costs. Molding material over the circuit die may be removed before or after curing, and hence an electronic package with superior thermal performance characteristics is made possible.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the following claims.

The invention claimed is:

1. A packaging method for a circuit die comprising:
   encapsulating a circuit component with molding material, the circuit component comprising a circuit die, an inner surface of a top mold plate used for containing the molding material during encapsulation being spaced vertically from a top surface of the circuit component during the encapsulating step so that the molding material forms a continuous top surface that covers and fully encapsulates the circuit component and at least a portion of a top surface of a substrate on which the circuit component is disposed;
   removing at least a portion of the molding material over the circuit die to create a recessed region within the molding material; and
   disposing a heat spreader over the recessed region of the molding material, a bottom surface of the heat spreader having a first downset disposed within the recessed region while a remainder of the bottom surface of the heat spreader is aligned with a top surface of the molding material, a top surface of the heat spreader having a second downset disposed over and aligned with at least a portion of the recessed region.

2. The method of claim 1 further comprising disposing an adhesive layer over at least a portion of the surface around or within the recessed region prior to disposing the heat spreader over the molding material and recessed region.

3. The method of claim 1 wherein substantially all of the molding material over at least a portion of the circuit die is removed to create the recessed region, and to minimize a distance between the circuit die and the heat spreader.

4. The method of claim 1 further comprising performing a curing procedure to cure the molding material.

5. The method of claim 4 wherein the curing procedure is performed after creating the recessed region.

6. The method of claim 1 wherein a laser is used to remove the portion of the molding material.

7. The method of claim 1 wherein encapsulating the circuit die comprises:

disposing the circuit component within a cavity defined by a mold, the cavity forming a gap between the circuit component and the mold plate; and introducing molding material into the cavity that fills the gap.

8. The method of claim 7 wherein a distance between an upper mold plate and a lower mold plate forming the mold is substantially greater than a height of the circuit component.

9. The method of claim 1 wherein an inner surface of a top mold plate used for containing the molding material during encapsulation is spaced vertically from a top surface of the circuit component during the encapsulating step so that the molding material forms a continuous top surface that covers and fully encapsulates the circuit component and at least a portion of a top surface of a substrate on which the circuit component is disposed.

10. An electronic device comprising:

a substrate;

external contacts electrically connected to the substrate;

a circuit die electrically connected to the substrate and having a first surface and a second surface, the second surface mechanically coupled to the substrate;

molding material encapsulating at least a portion of the substrate and at least a portion of the circuit die, the molding material forming a recessed region over the first surface; and a heat spreader thermally coupled to the circuit die, a bottom surface of the heat spreader having a first downset disposed within the recessed region while a remainder of the bottom surface of the heat spreader is aligned with a top surface of the molding material, a top surface of the heat spreader having a second downset disposed over and aligned with at least a portion of the recessed region.

11. The electronic device of claim 10 further comprising a spacer disposed between the recessed region and the first surface of the circuit die.

12. The electronic device of claim 11 wherein a top surface of the spacer is not covered by molding material.

13. The electronic device of claim 10 wherein the first surface is not covered by the molding material.

14. The electronic device of claim 10 wherein the molding material forms a continuous top surface that covers and fully encapsulates the circuit die and at least a portion of a top surface of the substrate.

* * * * *